United States Patent
Tateyanagi et al.

(10) Patent No.: US 7,440,386 B2
(45) Date of Patent: Oct. 21, 2008

(54) OPTICAL DEVICE AND METHOD OF MANUFACTURING THE SAME

(75) Inventors: Masaya Tateyanagi, Moriyama (JP); Masanori Minamio, Takatsuki (JP); Shigeki Okamoto, Kyoto (JP); Kiyoshi Fujihara, Ootsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 610 days.

(21) Appl. No.: 11/253,602

(22) Filed: Oct. 20, 2005

(65) Prior Publication Data

US 2006/0092812 A1     May 4, 2006

(30) Foreign Application Priority Data

Nov. 4, 2004    (JP) .............................. 2004-319966

(51) Int. Cl.
G11B 7/00    (2006.01)
(52) U.S. Cl. ..................................... 369/121
(58) Field of Classification Search ................. 369/121, 369/120, 44.12, 112.09
See application file for complete search history.

(56) References Cited

U.S. PATENT DOCUMENTS

| 6,519,044 | B1 * | 2/2003 | Holzapfel et al. ........... 356/616 |
| 6,859,325 | B2 * | 2/2005 | Kato et al. ................... 359/813 |
| 7,292,519 | B2 * | 11/2007 | Tatsuno et al. .............. 369/120 |
| 2001/0028621 | A1 * | 10/2001 | Moriyama ................... 369/120 |
| 2002/0075915 | A1 * | 6/2002 | Yagi ............................. 372/36 |
| 2004/0022141 | A1 * | 2/2004 | Nakamura et al. .......... 369/121 |
| 2004/0174801 | A1 * | 9/2004 | Yamada et al. .............. 369/125 |
| 2004/0252597 | A1 * | 12/2004 | Nakata et al. ............ 369/44.14 |
| 2005/0094694 | A1 * | 5/2005 | Fujihara et al. ............... 372/43 |
| 2005/0218313 | A1 * | 10/2005 | Kuroda ................. 250/231.13 |

FOREIGN PATENT DOCUMENTS

JP    2001-111159    4/2001

* cited by examiner

*Primary Examiner*—Thang V Tran
(74) *Attorney, Agent, or Firm*—Steptoe & Johnson LLP

(57) ABSTRACT

A copper frame plate (2) has a central frame plate (2a) and a pair of side frame plates (2c) bent from both ends of the central frame plate. A flexible substrate (3) has a central substrate (3a) covering the central frame plate and bent substrates (3b) bent from the central substrate so as to cover the side frame plates. An optical element (4) is mounted on the central frame plate. A plurality of internal wiring terminals (9) connected to the optical element are disposed on the central substrate and arranged in the width direction (W) along which the pair of side frame plates are opposed to each other. A plurality of external wiring terminals (11) used for connection to external equipment are disposed on the bent substrates and arranged in the length direction (L) orthogonal to the width direction.

12 Claims, 8 Drawing Sheets

OPTICAL DEVICE AND METHOD OF MANUFACTURING THE SAME

FIELD OF THE INVENTION

The present invention relates to an optical device in which a light receiving element such as an image sensor and an optical element such as a laser light emitting element are mounted on a mounting substrate, and a method of manufacturing the same.

BACKGROUND OF THE INVENTION

In recent years, optical disc drives for compact discs (CD-ROM, CD-R, CD-RW, etc.) and digital versatile discs (DVD-ROM, DVD-RW, DVD-RAM, etc.) serving as music media and information recording media have rapidly become prevalent. As for optical pickups serving as key components of optical disc drives, there is an increasing demand for high power responding to high-speed recording, high-performance responding to specifications of CDs and DVDs, and miniaturization responding to low-profile optical disc drives. Therefore, for optical devices used for optical pickups, it is necessary to increase thermal dissipation of packages achieving high power, increase the number of pins to respond to high performance, and design low-profile package structures for miniaturization. Conventionally optical devices (e.g., a hologram unit) in which optical elements such as a light receiving element and a laser light emitting element are mounted on mounting substrates have been widely used.

FIGS. 11 and 12 illustrate a publicly known optical device 41. FIG. 11 is a plan view and FIG. 12 is a sectional view taken along line X-X' of FIG. 11. The optical device 41 is constituted of a plurality of lead frames 42 having die pads and leads thereon, a resin package 43 formed by resin molding, a silicon substrate 44 having a 45-degree reflex mirror for reflecting laser light to the above of the package 43 and a circuit for receiving and processing light reflected from an optical disc, light receiving elements 45 integrated on the silicon substrate 44, a semiconductor laser 46 placed at the center of the package 43 via the silicon substrate 44, and a hologram element 47 on which grating patterns 47a and hologram patterns 47b are formed. Outer ends 42a of the lead frames 42 correspond to external wiring terminals used for connection with external equipment. The outer ends 42a are arranged in a width direction W of the package 43 and protrude to the outside of the package 43. When the optical device 41 is mounted in an optical pickup, the width direction W of the optical device 41 is equal to the thickness direction of an optical disc (not shown).

As shown in FIG. 12, emitted light 49 from the semiconductor laser 46 is reflected to the above of the package 43 by the reflex mirror of the silicon substrate 44, diffracted by the grating patterns 47a, and passes through the hologram element 47. Thereafter, the light passes through optical components (not shown) such as a collimate lens and an object lens and reaches the optical disc (not shown). Then, reflected light 50 from the optical disc returns through the same path, is diffracted by the hologram patterns 47b, and incident on the light receiving element 45.

However, for high power, high performance, and miniaturization of optical pickups, two objects have to be attained by the optical device. One object is to obtain higher thermal dissipation responding to high power and another object is to obtain a smaller pitch of the external wiring terminals (corresponding to the outer ends 42a of the lead frames 42 shown in FIGS. 11 and 12) in response to slimming down and high performance.

In general, an optical disc for high-speed recording requires high power of 200 mW or more as an optical output from a semiconductor laser unit. Accordingly, the driving current of a laser increases, the temperature of a laser device also increases, and thus the reliability of the laser decreases. Therefore, in order to stably drive the laser according to a change in ambient temperature, heat generated by the laser has to be dissipated efficiently. However, in the conventional optical device 41, the package 43 is made of a resin having a low thermal conductivity (0.5 W/m/deg), so that heat cannot be efficiently dissipated.

Packages with small widths are demanded for miniaturization of optical pickups. However, in the conventional optical device 41, the plurality of external wiring terminals (corresponding to the outer ends 42a of the lead frames 42) are arranged in the width direction W, and thus in order to increase the number of external wiring terminals to obtain high performance while responding to miniaturization, it is necessary to reduce a pin pitch (that is, a pitch between the external wiring terminals and the pin pitch corresponds to a pitch P between the outer ends 42a of the lead frames 42). The width W of the package 43 has to be set to, e.g., 3 mm or smaller for miniaturization; whereas at least 20 external wiring terminals are necessary for high performance. In this case, for example, when the width of the external wiring terminal (corresponding to the outer ends 42a of the lead frames 42) is set to 0.15 mm and the interval of the external wiring terminals is set to 0.15 mm, the pin pitch (corresponding to the pitch P between the outer ends 42a of the lead frames 42) has to be set to 0.3 mm, which is an extremely small value. Thus, the lead frame 42 becomes hard to work or a solder bridge is likely to be formed between the adjacent lead frames 42 upon mounting to external equipment, resulting in low workability and mountability.

Japanese Patent Laid-Open No. 2001-111159 discloses an optical device (semiconductor laser device) comprising a hologram element.

Therefore, an object of the present invention is to provide an optical device which can be readily mounted and achieves higher thermal dissipation, slimness with a smaller width, and a larger number of pins, and a method of manufacturing the same.

DISCLOSURE OF THE INVENTION

An optical device of the present invention comprising a bendable flexible substrate and an optical element on a metallic frame body, and an optically transparent member above the optical element via a frame, the frame body having a flat central frame plate and a pair of side frame plates bent from both ends of the central frame plate, the flexible substrate having a central substrate covering the central frame plate and bent substrates bent from the central substrate so as to cover the side frame plates, the flexible substrate being fixed on the frame body via the frame, the optical element being mounted in contact with a surface of the central frame plate of the frame body, the flexible substrate having internal wiring terminal groups each being composed of a plurality of internal wiring terminals connected to the optical element, external wiring terminal groups each being composed of a plurality of external wiring terminals used for connection to external equipment, and wiring patterns for connecting the internal wiring terminals and the external wiring terminals, the internal wiring terminals being disposed on the central substrate of the flexible substrate and arranged in the width direction which is parallel to the central frame plate of the frame body and is the opposing direction of the pair of side frame plates, and the external wiring terminals being arranged on the bent substrates of the flexible substrate and arranged in the length direction which is parallel to the central frame plate of the frame body and orthogonal to the width direction.

With this configuration, the external wiring terminals are arranged in the length direction orthogonal to the width direction of the optical device, thereby eliminating the need for slimming down in the width direction. Therefore, it is possible to increase the number of the external wiring terminals, increase a pitch between the external wiring terminals, and increase a width of the external wiring terminal. Hence, when the optical device 1 is mounted in external equipment, it is possible to prevent a bridge of solder or the like between the adjacent external wiring terminals to be formed, thereby easily mounting the optical device in external equipment.

Since the internal wiring terminals and the optical element are connected to each other by wire bonding and so on, it is only necessary to obtain a pitch between the internal wiring terminals and a width of the internal wiring terminal so as to perform wire bonding. Therefore, it is possible to dispose the internal wiring terminals in a small area, thereby reducing the width of the optical device.

The frame body is formed of a metal and thus has high thermal conductivity. The optical element is mounted in contact with the surface of the central frame plate of the frame body. Hence, heat generated on the optical element is directly transmitted from the optical element to the central frame plate and dissipated from the central frame plate. Then, the heat is transmitted from the central frame plate to the pair of side frame plates and dissipated from the side frame plates, thereby achieving high thermal dissipation. The thermal dissipation is further improved by increasing the height of the side frame plates. In this case, the side frame plates can be increased in height without restrictions on the dimensions of the width of the optical device, and thus it is possible to improve thermal dissipation while keeping the slimness of the optical device.

According to the optical device of the present invention, the optical element is constituted of a light emitting element.

According to the optical device of the present invention, the optical element is constituted of a light receiving element.

According to the optical device of the present invention, the optical element is constituted of a light emitting element and a light receiving element electrically connected to each other.

According to the optical device of the present invention, the optically transparent member is a glass plate.

According to the optical device of the present invention, the optically transparent member is a hologram element.

According to the optical device of the present invention, the frame is fit onto the frame body and the bent substrates of the flexible substrate are interposed and fixed between the frame and the side frame plates of the frame body.

With this configuration, it is possible to prevent the bent substrates of the flexible substrate from expanding in the opposite direction from the bending direction, thereby preventing the optical device from expanding in the width direction.

According to the optical device of the present invention, the flexible substrate is bonded and fixed on the frame body.

According to the optical device of the present invention, electronic components are mounted on the flexible substrate.

A method of manufacturing the optical device of the present invention comprises a first step of bending a metallic plate to form a frame body, a second step of placing a flexible substrate on the frame body, a third step of placing an optical element on a central frame plate of the frame body, a fourth step of electrically connecting the optical element and internal wiring terminals of the flexible substrate, a fifth step of bending the flexible substrate along the frame body and fitting a frame onto the frame body, and a sixth step of mounting an optically transparent member on the frame.

According to the method of manufacturing the optical device of the present invention, the third step has an upstream step of mounting a light emitting element constituting the optical element to a light receiving element, and a downstream step of placing the light receiving element on the central frame plate of the frame body.

According to the method of manufacturing the optical device of the present invention, the sixth step is performed before the fifth step.

DESCRIPTION OF THE EMBODIMENTS

The present invention will be specifically described below in accordance with the accompanying drawings.

Referring to FIGS. 1 to 6, the following will first describe Embodiment 1 of the present invention.

Figure 1:
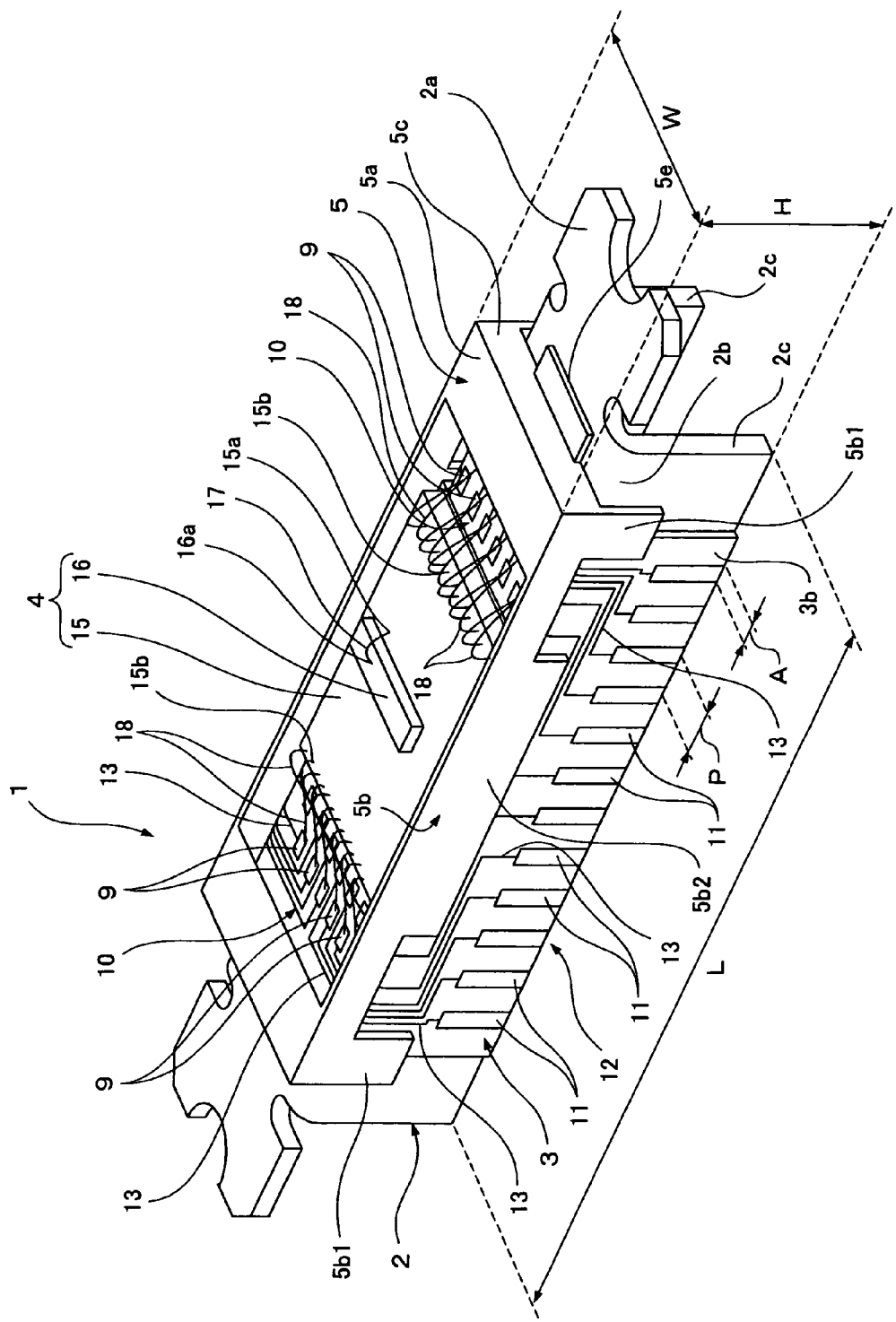
FIG. 1 is a perspective view showing an optical device according to Embodiment 1 of the present invention (a hologram element is omitted)

FIG. 1 is a perspective view showing an optical device 1. A hologram element or a glass plate is omitted in FIG. 1.

Figure 6:
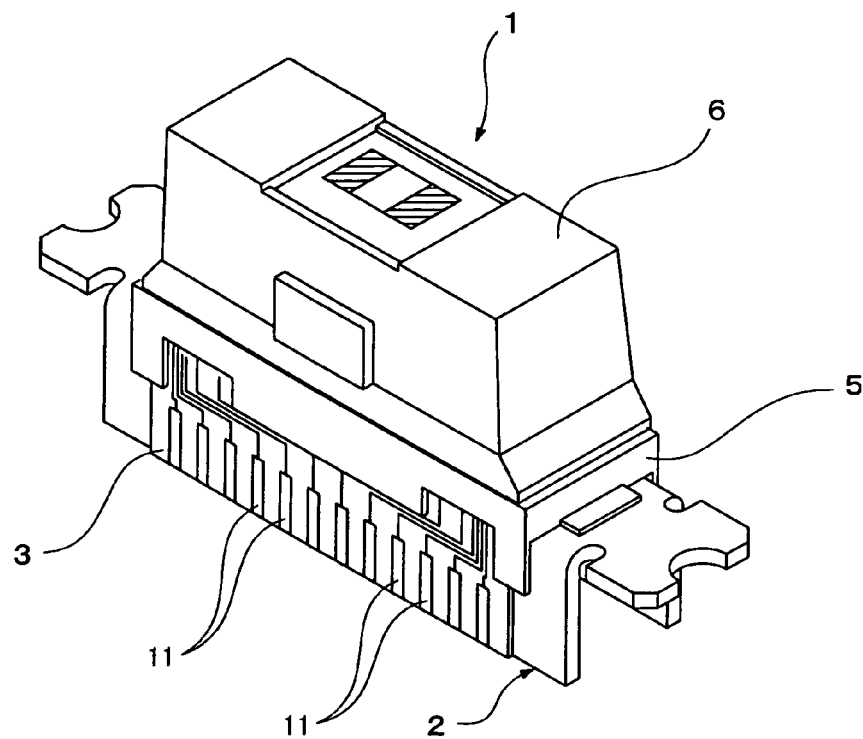
FIG. 6 is a perspective view showing the method of manufacturing the optical device and a state in which a hologram element is bonded and fixed on the frame.

As shown in FIG. 1, the optical device 1 has a frame body 2 composed of a copper plate (an example of a metallic frame) having a heat dissipating function, a flexible substrate 3 which is bendable on the frame body 2, and an optical element 4. As shown in FIG. 6, a hologram element 6 (an example of an optically transparent member) is provided above the optical element 4 via a frame 5.

Figure 2:
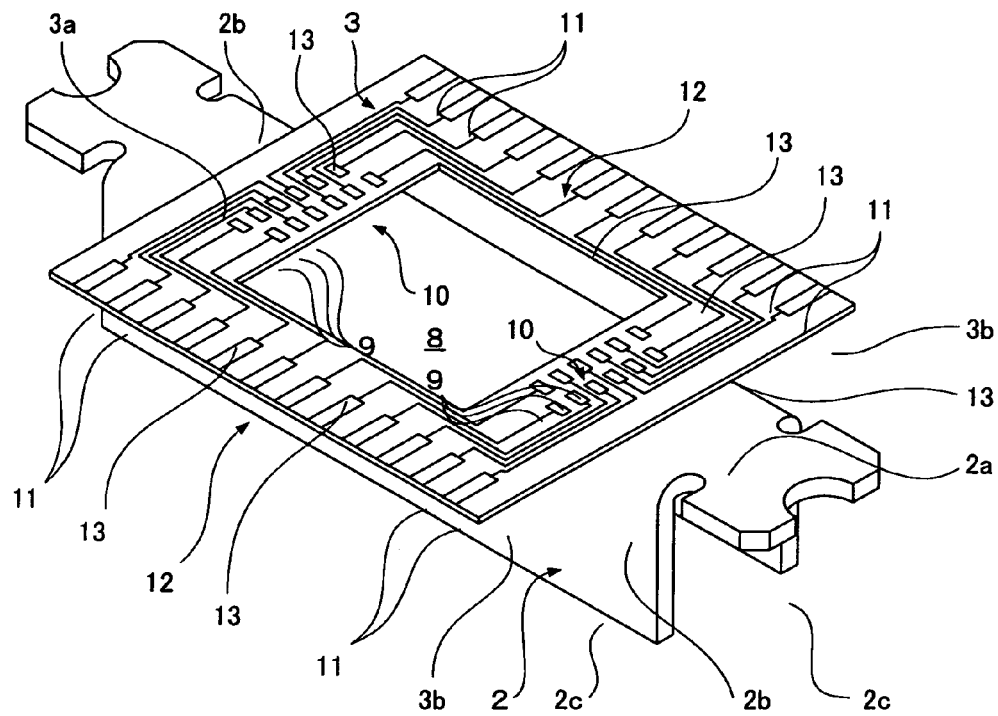
FIG. 2 is a perspective view showing a method of manufacturing the optical device and a state in which a flexible substrate is bonded and fixed on a frame body.

As shown in FIGS. 1 and 2, the frame body 2 is shaped like a letter U, which is composed of a flat central frame plate 2a and a pair of side frame plates 2c bent from bent parts 2b formed on both sides of the central frame plate 2a. A width direction W of the optical device 1 is in parallel with the central frame plate 2a and the opposing direction of the pair of side frame plates 2c. A length direction L of the optical device 1 is in parallel with the central frame plate 2a and orthogonal to the width direction W. A height direction H of the optical device 1 is orthogonal to the width direction W and the length direction L. When the optical device 1 is mounted in an optical pickup, the width direction W becomes equal to the thickness direction of an optical disc (not shown).

Figure 4:
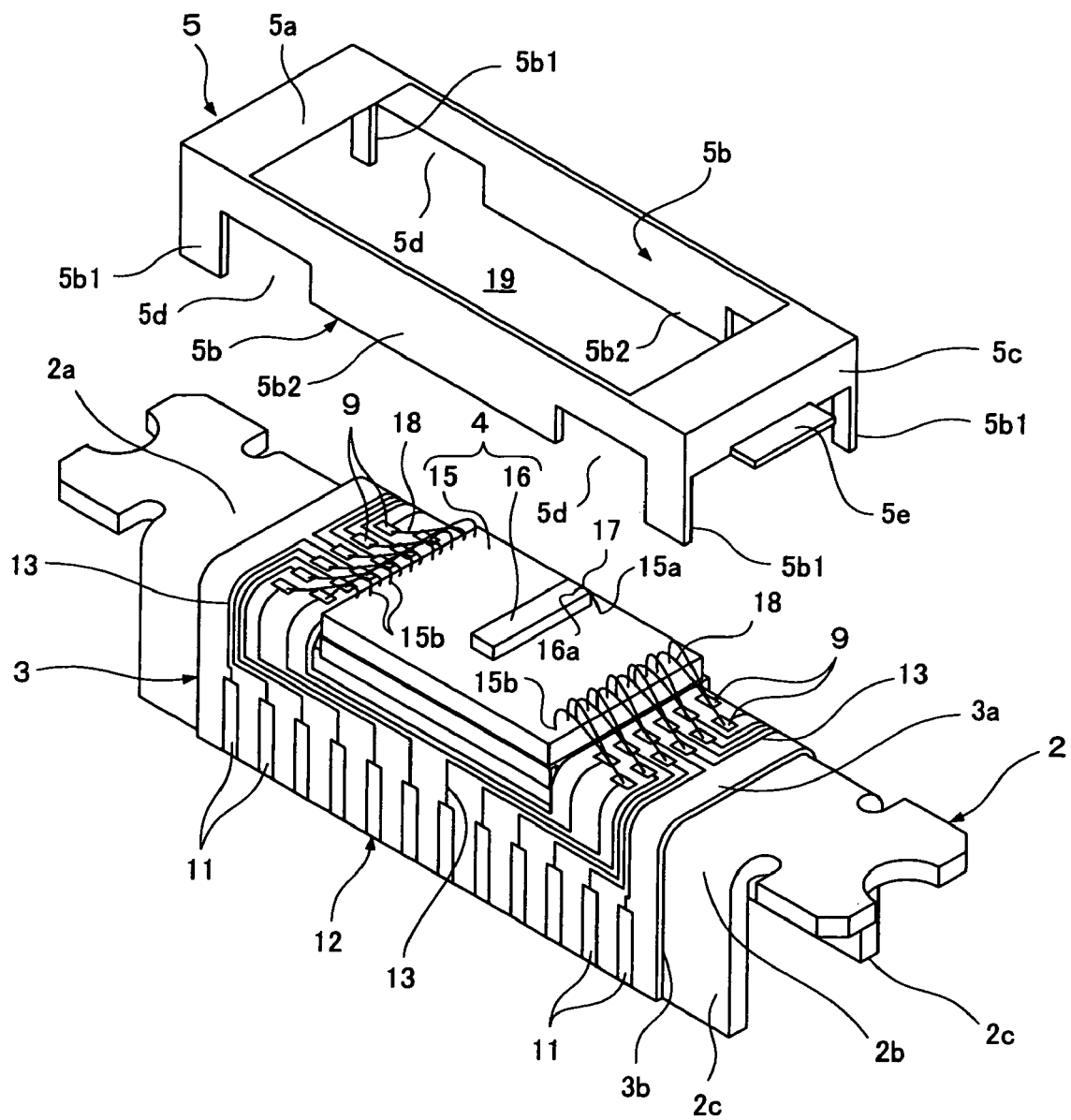
FIG. 4 is a perspective view showing the method of manufacturing the optical device and a state in which the flexible substrate is bent along the frame body.

As shown in FIG. 4, the flexible substrate 3 is bent along the bent parts 2b of the frame body 2. The flexible substrate 3 has a central substrate 3a covering the central frame plate 2a and a pair of bent substrates 3b which are bent from the central substrate 3a so as to cover the side frame plates 2c. The flexible substrate 3 is fixed on the frame body 2 by means of the frame 5. As shown in FIG. 2, an opened window 8 is formed at the center of the central substrate 3a of the flexible substrate 3. The central substrate 3a is bonded and fixed on the central frame plate 2a of the frame body 2.

As shown in FIGS. 1 and 2, the flexible substrate 3 comprises internal wiring terminal groups 10 each being composed of a plurality of internal wiring terminals 9 connected to the optical element 4, external wiring terminal groups 12 each being composed of a plurality of external wiring terminals 11 used for connection to external equipment, and a plurality of wiring patterns 13 for connecting the internal wiring terminals 9 and the external wiring terminals 11.

The internal wiring terminals 9 are disposed on both ends of the length direction L of the central substrate 3a of the flexible substrate 3 and are arranged in the width direction W. The opened window 8 is positioned between the internal wiring terminal groups 10 opposed to each other in the length direction L. The external wiring terminals 11 are disposed on the ends of the height direction H of the pair of bent substrates 3b of the flexible substrate 3 and are arranged in the length direction L.

In FIG. 1, the external wiring terminals 11 are disposed on the same positions as the ends of the side frame plates 2c of the frame body 2. The external wiring terminals 11 may be placed out of the ends of the side frame plates 2c.

The optical element 4 is constituted of a light receiving element 15 and a light emitting element 16 mounted on the light receiving element 15. An inner pad electrode 15a of the light receiving element 15 and a pad electrode 16a of the light emitting element 16 are electrically connected to each other via a metal thin line 17 by wire bonding. The light receiving element 15 is mounted in contact with a surface of the central frame plate 2a of the frame body 2 through the opened window 8 of the flexible substrate 3.

A plurality of external pad electrodes 15b are arranged in the width direction W on both ends of the length direction L of the light receiving element 15. The external pad electrodes 15b of the light receiving element 15 and the internal wiring terminals 9 of the flexible substrate 3 are electrically connected to each other via metal thin lines 18.

The side frame plates 2c of the frame body 2 are bent from the central frame plate 2a at positions exceeding larger one of the width of the optical element 4 and the width of the internal wiring terminal group 10.

As shown in FIG. 4, the frame 5 is constituted of a frame plate 5a having an opening 19, a pair of fitting plates 5b bent from both side ends of the width direction W of the frame plate 5a, and a pair of side plates 5c bent from both side ends of the length direction L of the frame plate 5a. Cut portions 5d are formed on the fitting plates 5b. The fitting plate 5b is divided into end plates 5b1 positioned between the cut portion 5d and both ends of the length direction L and a central plate 5b2 positioned between the end plates 5b1. The pair of side plates 5c have flanges 5e.

Figure 5:
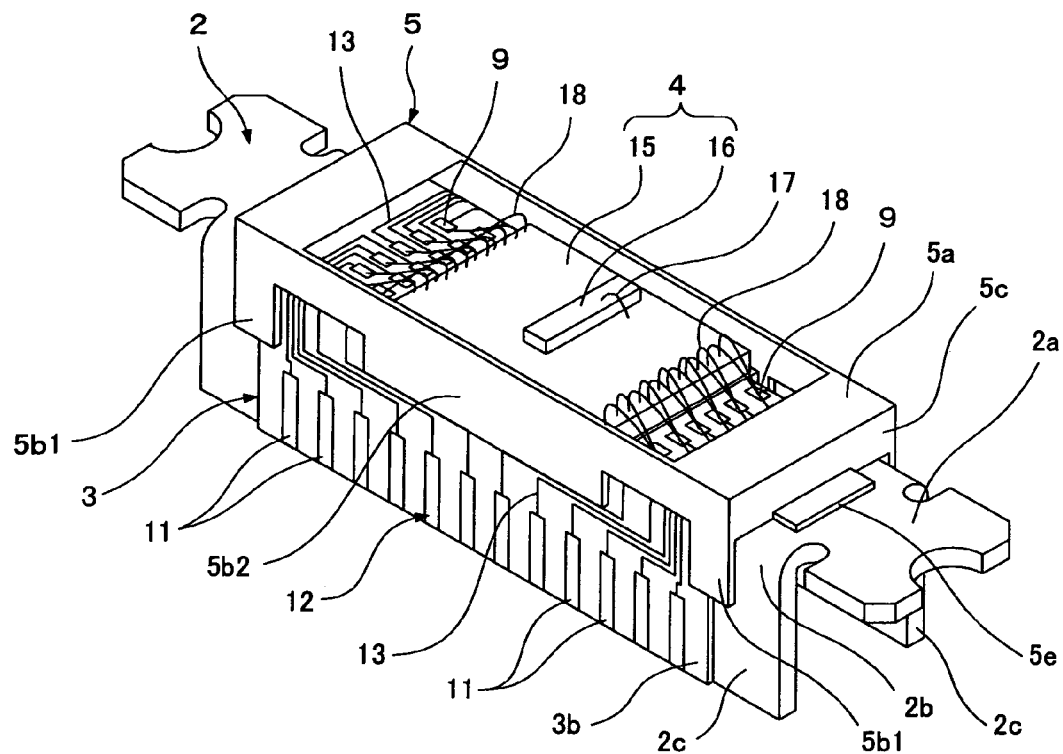
FIG. 5 is a perspective view showing the method of manufacturing the optical device and a state in which a frame is fit onto the frame body and fixed thereon.

As shown in FIG. 5, the pair of fitting plates 5b are fit onto the side frame plates 2c of the frame body 2, so that the frame 5 is fit onto the frame body 2 and the bent substrates 3b of the flexible substrate 3 are interposed and fixed between the side frame plates 2c and the end plates 5b1 of the frame 5.

As shown in FIG. 6, the hologram element 6 is bonded and fixed on the frame plate 5a of the frame 5. The light receiving element 15 includes an amplifier (not shown) for signal amplification. Electronic components (not shown) such as a capacitor and a resistor for stabilizing the operation of the amplifier are mounted on the wiring patterns 13.

The following will discuss a method of manufacturing the optical device 1.

First, in a first step, a copper plate (an example of a metallic plate) is bent to form the frame body 2. Then, in a second step, the flat flexible substrate 3 is placed on the frame body 2 as shown in FIG. 2, and the central substrate 3a is bonded and fixed on the central frame plate 2a. At this point, positioning is performed such that the center of the opened window 8 of the flexible substrate 3 and the internal wiring terminals 9 are placed on the central frame plate 2a of the frame body 2.

Figure 3:
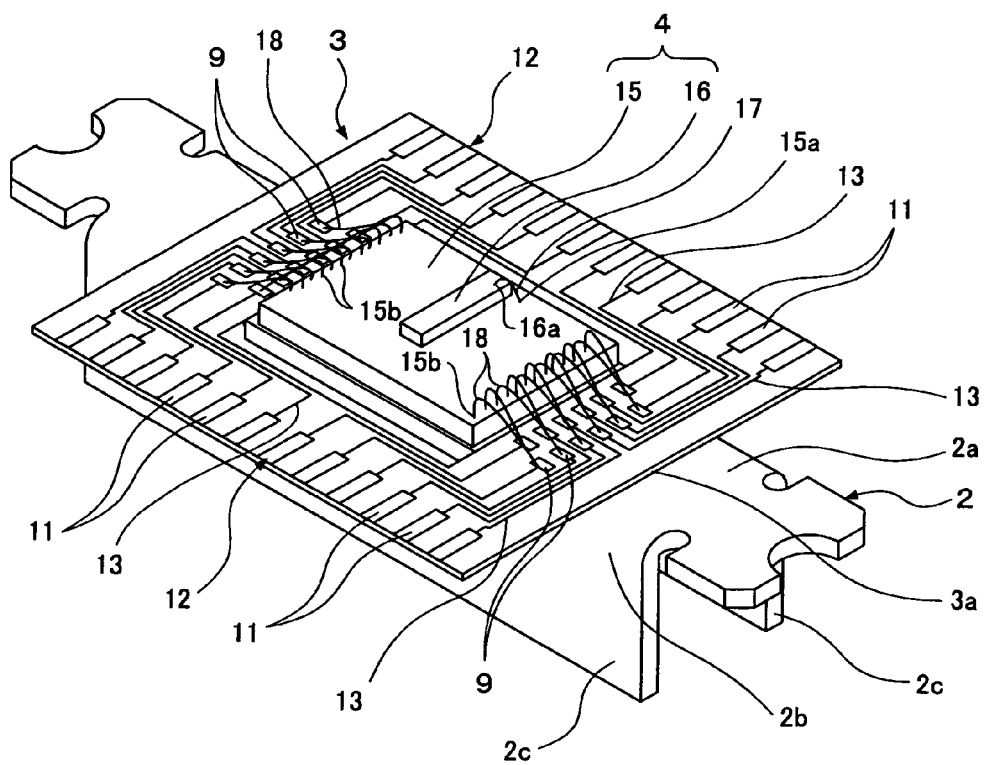
FIG. 3 is a perspective view showing the method of manufacturing the optical device and a state in which an optical element is placed on the frame body and wire bonded thereon.

A third step has an upstream step and a downstream step. In the upstream step, the light emitting element 16 is jointed onto the light receiving element 15. Then, in the downstream step, as shown in FIG. 3, the light receiving element 15 is directly placed on a surface of the central frame plate 2a of the frame body 2 through the opened window 8 of the flexible substrate 3 and is fixed thereon with an adhesive (silver paste or the like). Thus, the optical element 4 is placed on the central frame plate 2a.

Subsequently, in a fourth step, the pad electrode 16a of the light emitting element 16 and the inner pad electrode 15a of the light receiving element 15 are electrically connected to each other by wire bonding via the metal thin line 17, and the external pad electrodes 15b of the light receiving element 15 and the internal wiring terminals 9 of the flexible substrate 3 are electrically connected to each other via the metal thin lines 18.

In a fifth step, as shown in FIG. 4, the flexible substrate 3 is bent along the bent parts 2b of the frame body 2, and the pair of fitting plates 5b of the frame 5 are fit onto the pair of side frame plates 2c of the frame body 2 from the above of the optical element 4, so that the frame 5 is fit so as to cover the frame body 2 as shown in FIG. 5. Hence, the bent substrates 3b of the flexible substrate 3 are interposed and fixed between the side frame plates 2c and the end plates 5b1 of the frame 5. At this point, the flange 5e of the frame 5 comes into contact with the surface of the central frame plate 2a of the frame body 2 and the flange 5e is welded on the central frame plate 2a. Hence, the frame 5 is fixed on the frame body 2.

Thereafter, in a sixth step, the hologram element 6 is bonded and fixed on the frame plate 5a of the frame 5 as shown in FIG. 6.

The following will discuss the operation/working-effect of the optical device 1 manufactured according to the above method.

As shown in FIG. 1, the plurality of external wiring terminals 11 are arranged in the length direction L orthogonal to the width direction W of the optical device 1, thereby eliminating the need for reducing the width W. Therefore, it is possible to increase the number of the external wiring terminals 11, increase a pitch P between the external wiring terminals 11, and increase a width A of the external wiring terminal 11. Hence, when the optical device 1 is mounted in external equipment, it is possible to prevent a bridge of solder or the like between the adjacent external wiring terminals 11 to be formed, thereby easily mounting the optical device 1 in external equipment.

Further, the external wiring terminals 11 are supported by the side frame plates 2c of the frame body 2 from the back side of the flexible substrate 3, thereby eliminating the need for a tool or a facility mechanism for fixing the external wiring terminals 11 when the optical device 1 is mounted in external equipment. Thus, the optical device 1 can be more easily mounted in external equipment.

Since the internal wiring terminals 9 and the light receiving element 15 are connected to each other by wire bonding, it is only necessary to obtain a pitch between the internal wiring terminals 9 and a width of the internal wiring terminal 9 so as to perform wire bonding. Therefore, it is possible to dispose the internal wiring terminals 9 in a small area, thereby slimming down the optical device 1 in the width direction W.

The frame body 2 is formed of a copper plate and thus has high thermal conductivity. The light receiving element 15 is mounted in contact with the surface of the central frame plate 2a of the frame body 2 through the opened window 8 of the flexible substrate 3. Hence, heat generated on the optical element 4 is directly transmitted from the optical element 4 to the central frame plate 2a and dissipated from the central frame plate 2a. Then, the heat is transmitted from the central frame plate 2a to the pair of side frame plates 2c and dissipated from the side frame plates 2c, thereby achieving high thermal dissipation. The thermal dissipation is further improved by expanding the side frame plates 2c along the height direction H. In this case, the side frame plates 2c can be expanded in the height direction H without restrictions on the dimensions of the width W of the optical device 1, and thus it is possible to improve thermal dissipation while keeping the slimness of the optical device 1 in the width direction W.

The bent substrates 3b of the flexible substrate 3 are interposed and fixed between the side frame plates 2c and the end plates 5b1 of the frame 5. Thus, it is possible to prevent the bent substrates 3b from expanding in the opposite direction from the bending direction, thereby preventing the optical device 1 from expanding in the width direction W.

In the method of manufacturing the optical device 1, as shown in FIGS. 4 and 5, the flexible substrate 3 is bent and the frame 5 is fit onto the frame body 2 in the same fifth step. Hence, it is possible to manufacture the low-profile optical device 1 with a simple method.

Figure 7:
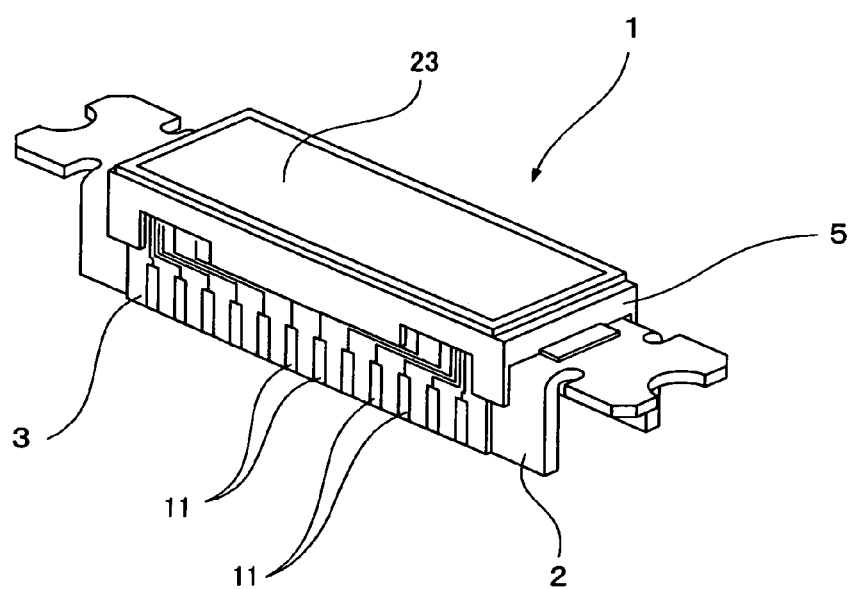
FIG. 7 is a perspective view showing an optical device according to Embodiment 2 of the present invention.

In Embodiment 1, as shown in FIG. 6, the hologram element 6 is bonded and fixed as an example of an optically transparent member onto the frame plate 5a of the frame 5. In Embodiment 2, as another example of an optically transparent member, a glass plate 23 is bonded and fixed instead of the hologram element 6 onto a frame plate 5a of a frame 5 as shown in FIG. 7.

Figure 8:
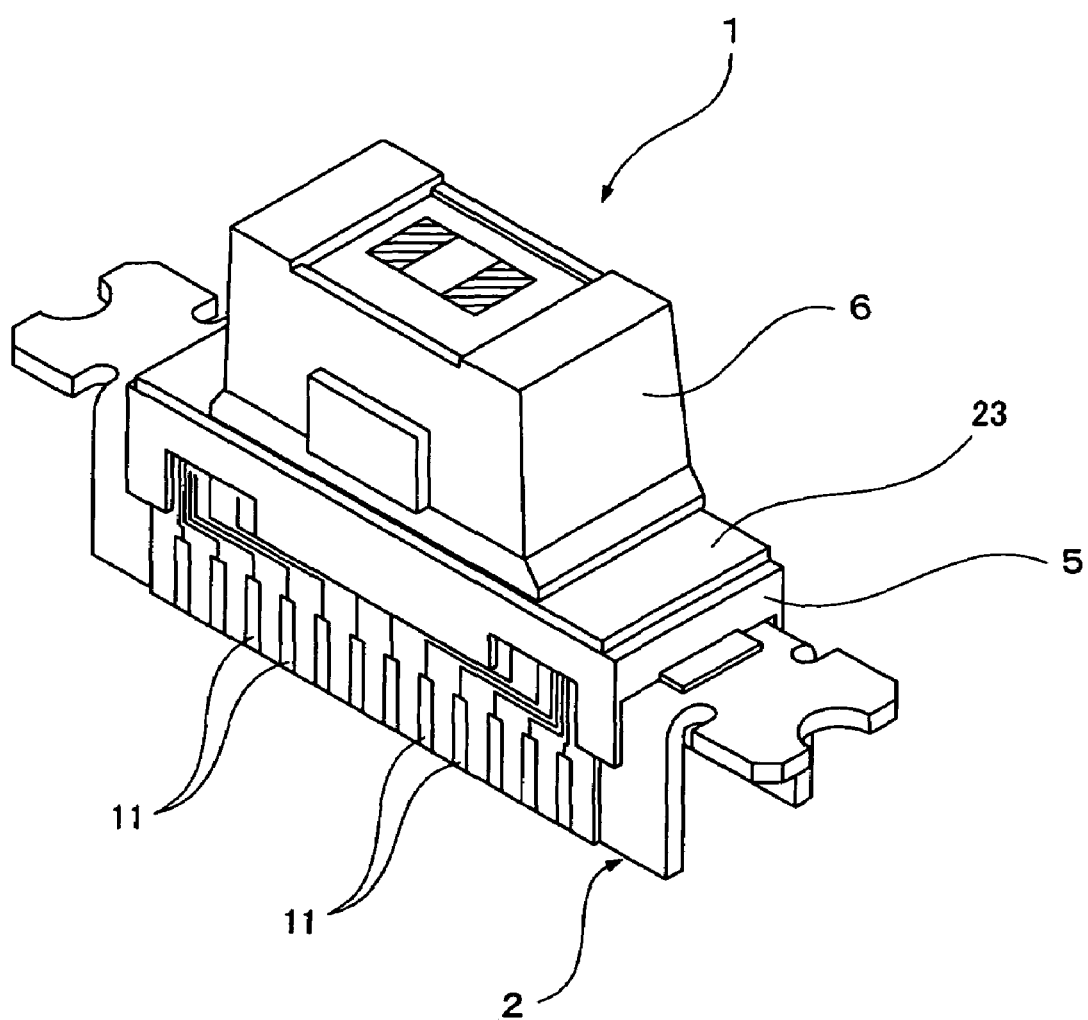
FIG. 8 is a perspective view showing an optical device according to Embodiment 3 of the present invention.

In Embodiment 3, as shown in FIG. 8, a glass plate 23 is bonded and fixed as another example of an optically transparent member onto a frame plate 5a of a frame 5, and a hologram element 6 is bonded and fixed on the glass plate 23.

In Embodiment 4, the sixth step in the method of manufacturing the optical device 1 of Embodiment 1 is performed before the fifth step.

Figure 9:
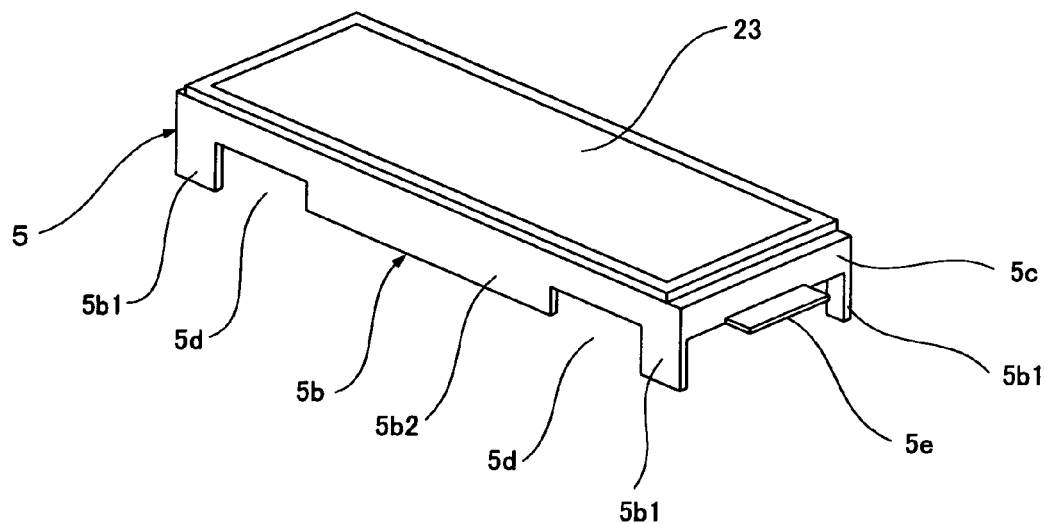
FIG. 9 is a perspective view showing a method of manufacturing an optical device according to Embodiment 4 of the present invention and a state in which a glass plate is bonded and fixed on the frame.

To be specific, after the first to fourth steps of Embodiment 1, in the fifth step, the glass plate 23 (or the hologram element 6) is bonded and fixed on the frame plate 5a of the frame 5 as shown in FIG. 9.

Figure 10:
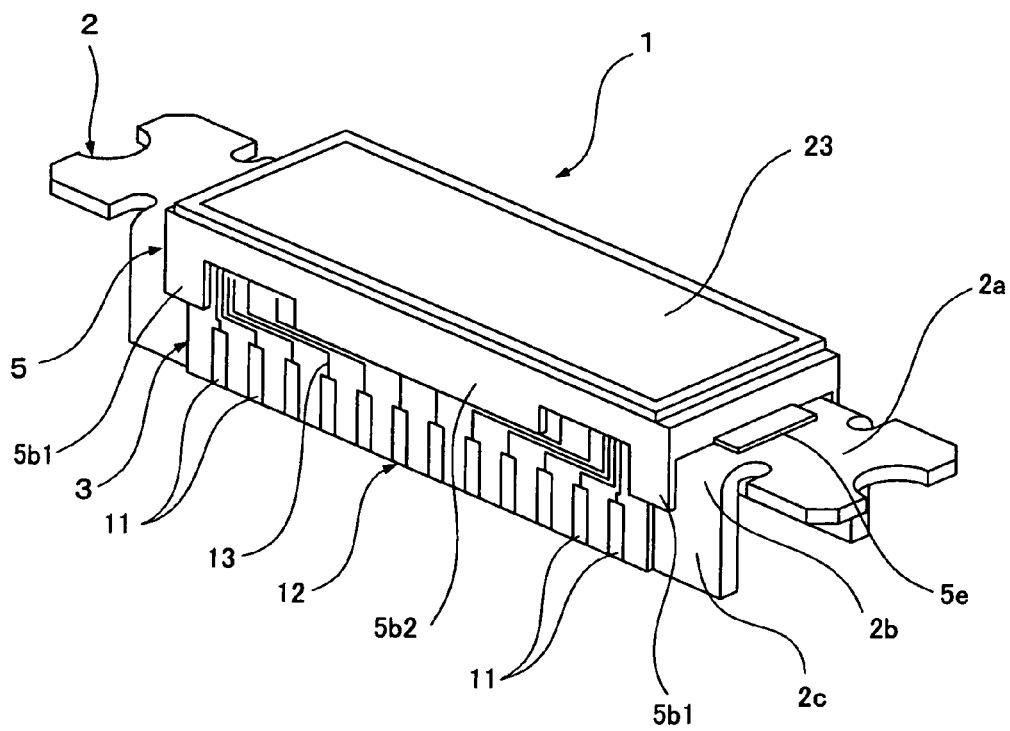
FIG. 10 is a perspective view showing the method of manufacturing the optical device and a state in which a frame is fit onto a frame body and fixed thereon.
Figure 11:
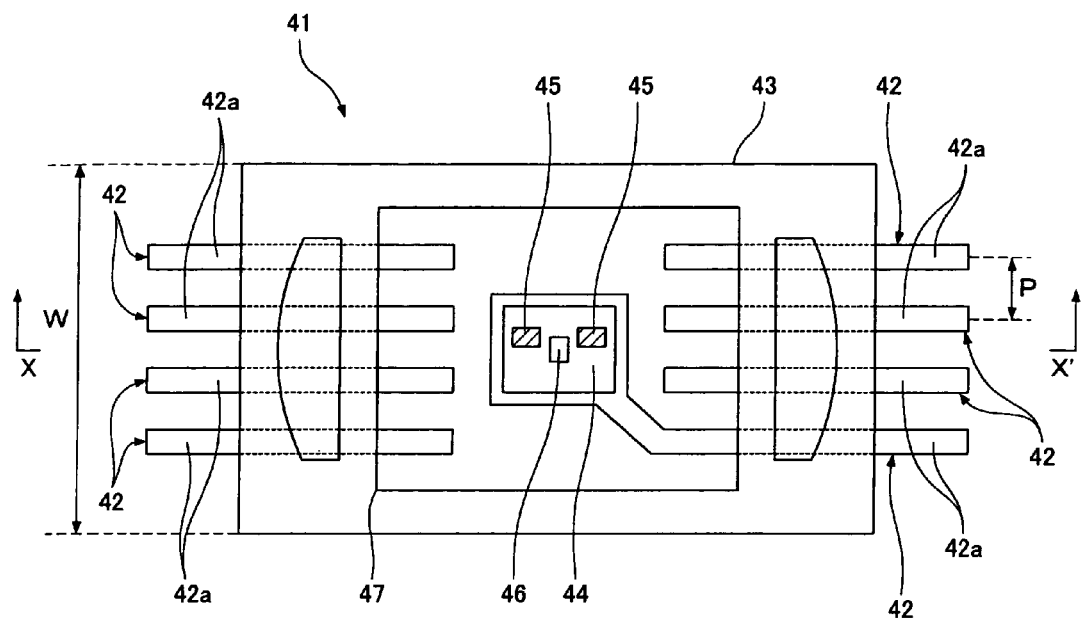
FIG. 11 is a plan view showing a conventional optical device.
Figure 12:
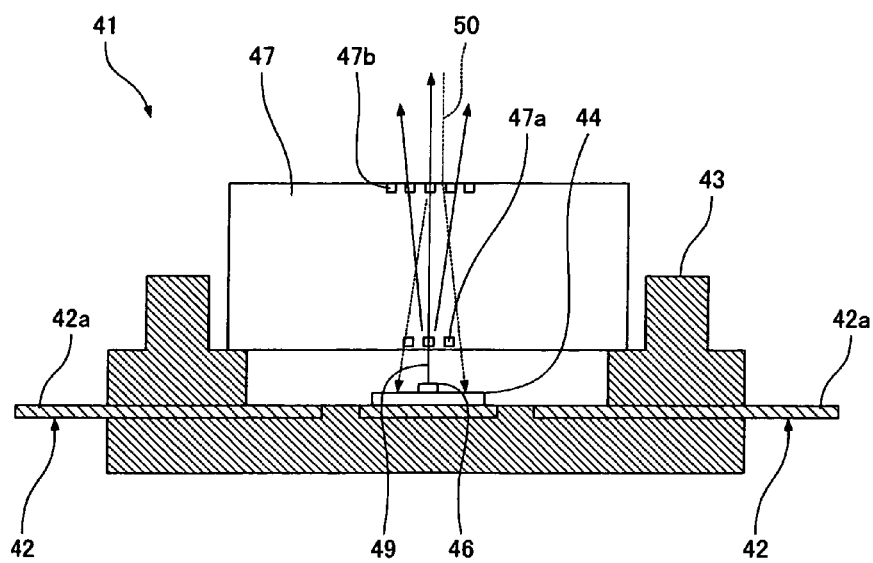
FIG. 12 is a sectional view taken along line X-X' of FIG. 11.

Thereafter, in the sixth step, as shown in FIG. 10, the flexible substrate 3 is bent along the bent parts 2b of the frame body 2, and the pair of fitting plates 5b of the frame 5 are fit onto the pair of side frame plates 2c of the frame body 2 from the above of the optical element 4, so that the frame 5 is fit so as to cover the frame body 2. The flange 5e is welded on the central frame plate 2a. With these steps, the frame 5 having the glass plate 23 is fixed on the frame body 2 and thus the optical device 1 is completed.

In the foregoing embodiments, the optical element 4 is constituted of the light receiving element 15 and the light emitting element 16. The optical element 4 may be constituted only of the light receiving element 15 or only of the light emitting element 16.

In the foregoing embodiments, the copper plate is bent to form the frame body 2. Other metallic plates having high thermal conductivity may be used to form the frame body 2.

In the foregoing embodiments, as shown in FIG. 5, the flange 5e is welded on the central frame plate 2a to fix the frame 5 on the frame body 2. Instead of welding, the flange 5e may be bonded to the central frame plate 2a with an adhesive. Further, without using welding or an adhesive, the frame 5 may be fixed on the frame body 2 only by a tightening force generated by a fit between the frame 5 and the frame body 2.

What is claimed is:

1. An optical device, comprising:
   a bendable flexible substrate and an optical element on a metallic frame body; and
   an optically transparent member above the optical element via a frame,
   the frame body having a flat central frame plate and a pair of side frame plates bent from both ends of the central frame plate,
   the flexible substrate having a central substrate covering the central frame plate and bent substrates bent from the central substrate so as to cover the side frame plates, the flexible substrate being fixed on the frame body via the frame,
   the optical element being mounted in contact with a surface of the central frame plate of the frame body,
   the flexible substrate having internal wiring terminal groups each being composed of a plurality of internal wiring terminals connected to the optical element, external wiring terminal groups each being composed of a plurality of external wiring terminals used for connection to external equipment, and wiring patterns for connecting the internal wiring terminals and the external wiring terminals,
   the internal wiring terminals being disposed on the central substrate of the flexible substrate and arranged in a width direction which is parallel to the central frame plate of the frame body and is an opposing direction of the pair of side frame plates, and
   the external wiring terminals being arranged on the bent substrates of the flexible substrate and arranged in a length direction which is parallel to the central frame plate of the frame body and orthogonal to the width direction.

2. The optical device according to claim 1, wherein the optical element is constituted of a light emitting element.

3. The optical device according to claim 1, wherein the optical element is constituted of a light receiving element.

4. The optical device according to claim 1, wherein the optical element is constituted of a light emitting element and a light receiving element electrically connected to each other.

5. The optical device according to claim 1, wherein the optically transparent member is a glass plate.

6. The optical device according to claim 1, wherein the optically transparent member is a hologram element.

7. The optical device according to claim 1, wherein the frame is fit onto the frame body and the bent substrates of the flexible substrate are interposed and fixed between the frame and the side frame plates of the frame body.

8. The optical device according to claim 1, wherein the flexible substrate is bonded and fixed on the frame body.

9. The optical device according to claim 1, wherein an electronic component is mounted on the flexible substrate.

10. A method of manufacturing the optical device of claim 1, comprising:
 a first step of bending a metallic plate to form the frame body;
 a second step of placing the flexible substrate on the frame body;
 a third step of placing the optical element on the central frame plate of the frame body;
 a fourth step of electrically connecting the optical element and internal wiring terminals of the flexible substrate;
 a fifth step of bending the flexible substrate along the frame body and fitting the frame onto the frame body; and
 a sixth step of mounting the optically transparent member on the frame.

11. The method of manufacturing the optical device according to claim 10, wherein the third step has an upstream step of mounting a light emitting element constituting the optical element to a light receiving element, and a downstream step of placing the light receiving element on the central frame plate of the frame body.

12. The method of manufacturing the optical device according to claim 10, wherein the sixth step is performed before the fifth step.

* * * * *